United States Patent [19]

Huizer

[11] Patent Number: 5,477,182

[45] Date of Patent: Dec. 19, 1995

[54] DELAY CIRCUIT FOR DELAYING DIFFERENTIAL SIGNALS INCLUDES SEPARATELY CONTROLLABLE FIRST AND SECOND LOAD AND CLAMP CIRCUITS FOR EFFECTING DIFFERENT DELAY TIMES

[75] Inventor: Cornelis M. Huizer, Veldhoven, Netherlands

[73] Assignee: U.S. Philips Corporation, New York, N.Y.

[21] Appl. No.: 222,215

[22] Filed: Apr. 1, 1994

[30] Foreign Application Priority Data

Apr. 5, 1993 [EP] European Pat. Off. .............. 93200986
Aug. 24, 1993 [EP] European Pat. Off. .............. 93202488

[51] Int. Cl.6 ..................................................... H03H 11/26
[52] U.S. Cl. .......................... 327/261; 327/269; 327/272; 327/309; 331/57
[58] Field of Search ..................................... 327/261, 262, 327/264, 266, 269, 270, 271, 272, 274, 287, 309; 331/57

[56] References Cited

U.S. PATENT DOCUMENTS

| | | | |
|---|---|---|---|
| 3,887,823 | 6/1975 | Nikami | 307/293 |
| 4,277,703 | 7/1981 | Wada et al. | 307/553 |
| 4,293,781 | 10/1981 | Yamada et al. | 307/273 |
| 4,629,971 | 12/1986 | Kirk | 323/289 |
| 4,649,298 | 3/1987 | Tuhy, Jr. | 307/473 |
| 4,686,489 | 8/1987 | Caspell | 331/57 |
| 4,691,174 | 9/1987 | Nelson et al. | 330/260 |
| 4,720,643 | 1/1988 | Embree et al. | 307/351 |
| 4,755,741 | 7/1988 | Nelson | 323/289 |
| 4,760,319 | 7/1988 | Janz | 318/616 |
| 4,876,519 | 10/1989 | Davis et al. | 331/57 |
| 4,893,036 | 1/1990 | Hester et al. | 327/262 |
| 5,146,121 | 9/1992 | Searles et al. | 307/603 |

Primary Examiner—Timothy P. Callahan
Assistant Examiner—Kenneth B. Wells
Attorney, Agent, or Firm—Edward W. Goodman

[57] ABSTRACT

A delay circuit includes a first and a second switching transistor, each of which has a control electrode and a first and a second main electrode, a first and a second input of the delay circuit being coupled to the control electrode of the first switching transistor and the second switching transistor, respectively. A first and a second output of the delay circuit are coupled to the second electrode of the first and the second switching transistors, respectively. The first electrodes of the first and the second switching transistors are coupled to one another and, via a current source, to a first power supply terminal. The outputs are coupled to a second power supply terminal via respective load circuits. Respective clamp circuits are coupled to the outputs in order to limit maximum attainable differences between a voltage on the second power supply terminal on the one side and a voltage on the respective outputs on the other side.

14 Claims, 4 Drawing Sheets

DELAY CIRCUIT FOR DELAYING DIFFERENTIAL SIGNALS INCLUDES SEPARATELY CONTROLLABLE FIRST AND SECOND LOAD AND CLAMP CIRCUITS FOR EFFECTING DIFFERENT DELAY TIMES

BACKGROUND OF THE INVENTION

1. Field of the Invention

The invention relates to a delay circuit suitable for delaying differential signals, comprising a first and a second switching transistor, each of which comprises a control electrode and a first and a second main electrode, a first and a second input of the delay circuit being coupled to the control electrode of the first switching transistor and the second switching transistor, respectively, the first main electrode of the first and the second switching transistors being coupled to one another and, via a first current source, to a first power supply terminal, the second main electrode of the first and the second switching transistors being coupled to a first and a second output, respectively, of the delay circuit, the first and second outputs being coupled to a second power supply terminal via respective first load circuits. The invention also relates to a cascade of such delay circuits.

2. Description of the Related Art

A delay circuit of this kind is known from U.S. Pat. No. 5,146,121. The first and the second switching transistors control the connection between the current source and the load circuits. Depending on the difference between the voltages on the inputs, the current flows from the current source through the first or through the second switching transistor to the first or to the second output, respectively, and to the associated load circuit. Thus, the capacitance present on the output is alternately charged or discharged, depending on the difference.

For example, when the first switching transistor is turned on, the voltage on the first output decreases due to the discharging until the current source and the first switching transistor are saturated. The voltage on the second output increases until the associated load circuit is saturated.

When the input voltage changes so that the second switching transistor is turned on and the first switching transistor is turned off, the voltage on the second output decreases and the voltage on the first output increases. After a delay time on the outputs, a voltage level is thus reached which suffices to switch over other circuits. The rise and fall speed, and hence the delay time, can be adjusted by means of the current through the current source.

However, the switching time is also dependent on the initial voltage at the instant of switching over of the input voltage. When the switching transistor ceases to be turned on, the initial voltage is dependent notably on the saturation properties of the switching transistors and on the current source. Thus, the initial voltage is dependent on a spread in the parameters of these switching transistors. Consequently, the delay time is not reproducible very well.

SUMMARY OF THE INVENTION

It is inter alia an object of the invention to provide a delay circuit in which the reproducibility of the delay time is enhanced.

To achieve this, the delay circuit in accordance with the invention is characterized in that respective first clamp circuits are coupled to the first and the second outputs in order to limit maximum attainable differences between a voltage on the second power supply terminal on the one side and a voltage on the respective outputs on the other side. The clamp circuit thus provides the initial voltage for switching. The initial voltage, therefore, is not dependent on the parameters of the first and the second switching transistors or on the current source. The time required to reach a predetermined voltage level, therefore, is less dependent on the parameters of the switching transistors.

An embodiment of the delay circuit in accordance with the invention is characterized in that it comprises a second current source, second load circuits and second clamp circuits, as well as switching means for simultaneous connection of these components in parallel with the first current source, the respective first load circuits and the respective first clamp circuits, respectively. The further circuits enable digital switching of the delay time between different values.

A further embodiment of the delay circuit in accordance with the invention is characterized in that it is included in an integrated circuit in which each time a pair of respective, similar circuits are used for the first and the second current sources, the first and the second load circuits and the first and the second clamp circuits, wherein a ratio of the geometrical dimensions of the circuits of each pair is the same. All circuits directly relating to the delay time, as well as their inherent parasitic capacitances, are thus increased to the same scale upon switching on. Consequently, the ratio of the delay times with and without parallel-connected circuits is dependent notably on the ratio of the geometrical dimensions of the circuits. The ratio of the dimensions is accurately reproducible. Therefore, the ratio of the switching times is also suitably reproducible.

A further embodiment of the delay circuit in accordance with the invention is characterized in that it comprises a third and a fourth switching transistor which are connected, in as far as the control electrode and the second main electrode are concerned, parallel to the first and the second switching transistors, respectively, the first electrodes of the third and the fourth switching transistors being coupled to one another and, separately from the first electrodes of the first and the second switching transistors, to the first power supply terminal via the second current source. Due to the double construction of the switching transistors, the ratio of the switching times is also rendered independent of the process parameters when the input signals switch over only gradually.

A further embodiment of the delay circuit in accordance with the invention is characterized in that it comprises, between the first current source and the first output, a parallel connection of a first and a second series connection of main current channels of transistors, the first switching transistor forming part of the first series connection having control electrodes which are coupled to the first input and a first selection input, respectively, the second series connection having control electrodes which are coupled to a further first input and a second selection input, respectively, and in that it comprises a third and a fourth series connection of main current channels of transistors, connected in parallel between the second current source and the second output, the second switching transistor forming part of the third series connection which has control electrodes which are coupled to the second input and the first selection input, respectively, the fourth series connection comprising control electrodes which are coupled to a further second input and the second selection input, respectively. The delay circuit can thus multiplex between different input signals.

The use of delay circuits in accordance with the invention in a cascade is particularly attractive. Selective switching over of the delay times of a part of the delay circuits in a cascade of such circuits enables digital adjustment of the overall delay time of the cascade. In a cascade in accordance with the invention, comprising at least one delay circuit which also operates as a multiplexer, part of the cascade can be bypassed in a controlled manner. The adjustability of the delay time of the cascade is thus further improved.

A further embodiment of the cascade in accordance with the invention is characterized in that the outputs of one of the delay circuits, indirectly preceding the at least one delay circuit in the cascade, are connected to the further first and second inputs of the at least one delay circuit in the cascade. The cascade thus constitutes a ring oscillator. The number of stages thereof can be switched by means of the multiplexer. For the oscillation, it is irrelevant whether or not the number of stages becomes even due to the switching of the multiplexer, because differential delay elements are used.

BRIEF DESCRIPTION OF THE DRAWINGS

The invention will be described in detail hereinafter with reference to the accompanying drawings. Therein.

DESCRIPTION OF THE PREFERRED EMBODIMENT

Figure 1:
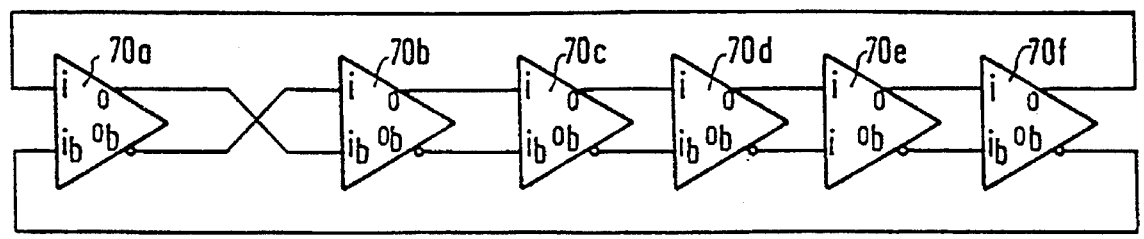
FIG. 1 shows an end-around coupled delay chain with symmetrical buffers.

FIG. 1 shows a delay chain which is coupled end-around and which comprises 6 symmetrical buffers 70a–70f. Each buffer comprises a pair of inputs i, ib and a pair of outputs o, ob. In a full loop along the chain, the gain is negative (because the input and the output between two buffers 70a, 70b are cross-wise coupled: o to ib and i to ob). Because of the negative gain, the circuit will oscillate. The use of symmetrical buffers 70a–70f offers the advantage that a negative loop gain can be obtained even with an even number of buffers 70a–70f in the chain. The relationship between the phase of the signal in the chain and the phase of the oscillation is given by the following Table, in which each line represents a combination of logic states of the outputs "o" of successive buffers, in the left-hand column, whereas the right-hand column shows the associated phase in twelfth parts of 360 degrees.

| | |
|---|---|
| 000000 | 0 |
| 010000 | 1 |
| 011000 | 2 |
| 011100 | 3 |
| 011110 | 4 |
| 011111 | 5 |
| 111111 | 6 |
| 101111 | 7 |
| 100111 | 8 |
| 100011 | 9 |
| 100001 | 10 |
| 100000 | 11 |

For the sampling of the phase of the oscillator use can also be made of differential symmetrical circuits. This eliminates phase sampling errors which are dependent on the logic value of the sampled signal due to any asymmetry between delays for signals of different logic levels.

Figure 2:
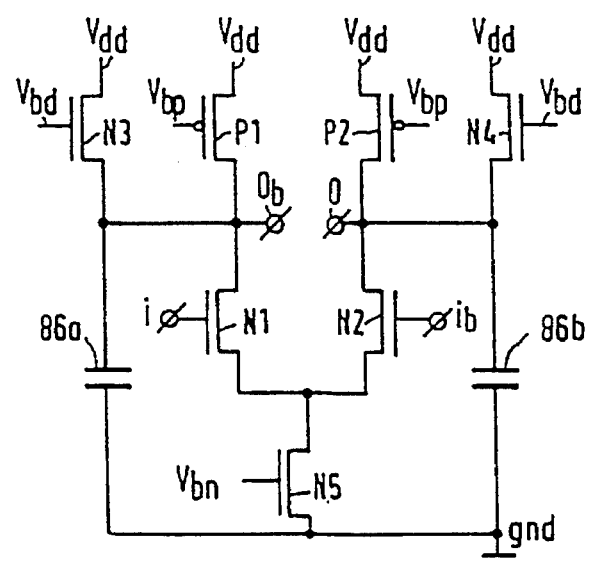
FIG. 2 shows a symmetrical buffer.

FIG. 2 shows a symmetrical buffer for use in the cascade of FIG. 1. It comprises an NMOS transistor N5 whose source is coupled to a first power supply (gnd). The drain of the NMOS transistor N5 is coupled, via two parallel branches, to a second power supply. Each branch comprises an NMOS switching transistor N1, N2 whose source is coupled to the drain of the NMOS transistor N5. The drains of the switching transistors N1, N2 are connected, via respective parallel connections of a PMOS load transistor P1, P2 with a clamp transistor N3, N4, to the second power supply $V_{dd}$. The gates of the switching transistors N1, N2 constitute the inputs i, ib of the buffer. The drains of the switching transistors N1, N2 constitute the outputs o, ob of the buffer. Between the outputs o, ob and the first power supply (gnd), capacitors 86a, 86b are shown in FIG. 2. The switching transistors N1, N2 have the same dimensions; the same holds for the load transistors P1, P2.

During operation, the gate voltages $V_{bn}$ and $V_{bp}$ of the NMOS transistor N5 and the PMOS load transistors P1, P2 are controlled so that the current I through the PMOS transistors P1, P2 in the saturated condition amounts to half the current 2I through the NMOS transistor N5. The signal on the input i, ib switches the switching transistors N1, N2 from a position in which the current flows from the NMOS transistor N5 to one of the PMOS load transistors P1, P2, to a position in which this current flows to the other one of the PMOS transistors P1, P2. In the one position one of the capacitors, say 86a, is charged by a net current amounting to I, whereas the other position, the capacitor 86b is discharged by a net current amounting to I.

Consequently, the amount of charge across the one capacitor 86a increases linearly in time. As a result, the voltage on the corresponding output ob also increases linearly in time. This continues until the increasing voltage brings the load transistor P1 out of the saturated state, after which the charging current decreases. The voltage on the other output "o" decreases linearly in time. This continues until the voltage "o" on this output decreases to the clamp voltage $V_{bd}-V_{th}$ at which the clamp transistor N4 is turned on. In the other position of the switching transistors N1, N2, the voltage on the output ob decreases linearly as a function of time until it reaches $V_{bd}-V_{th}$ (N3 is turned on when its source voltage is below its gate voltage $V_{bd}$ by an amount which exceeds a threshold voltage $V_{th}$). The voltage on the other output "o" increases linearly until the load transistor P2 is no longer saturated.

The switching time of the buffer is approximately equal to the period of time required to reverse the polarity of the difference between the voltages on the outputs o, ob. This time is proportional to the current I through the load transistors P1, P2.

The clamp transistors N3, N4 render the switching time independent of the saturation properties of the switching transistors N1, N2 and the NMOS transistor N5. This is achieved in that the clamp transistors N3, N4 determine the lowest voltages on the outputs o, ob, and hence the voltage difference to be overcome by the buffer by charging the capacitors 86a, 86b, before reversal of the polarity of the difference between the output voltages. This is attractive because the effect of temperature variations and a spread in the process parameters on the NMOS transistor N5 and the switching transistors N1, N2 thus has no effect on the switching time. A similar independence can be achieved by replacing the clamp transistors N2, N3, for example, with diodes which also limit the minimum voltage to be reached. In that case this voltage is limited to the diode threshold voltage and cannot be adjusted.

The capacitors 86a, 86b can be explicitly provided, but in order to achieve an oscillator with an as high as possible frequency, it suffices to utilize the parasitic capacitances always present in the circuit, so that no discrete capacitors need be provided.

It is one of the objects of the invention to realize the advantages of the digital technique in a phase loop. Attention is focused notably on the advantage that the functional behavior of digital circuits is insensitive to a spread in the parameters of the circuit used. In the phase loop as described above, the ring oscillator constitutes the main component whose behavior is still sensitive to parameter spreads. It is a problem notably that the ratio of the delay times realized with different settings of the buffer is sensitive to process parameters. When the oscillator is used in a digitally controlled phase locked loop, this ratio, together with the instantaneous oscillation frequency, is decisive in respect of loop gain, and hence in respect of dynamic behavior of the phase locked loop which must be as reproducible as possible.

The absolute delay time can be adjusted by adjusting the voltages $V_{bn}$ and $V_{bp}$, and hence the charging current I. However, it has been found that when it is attempted to realize different delay times in this manner, the parameters of the transistors have an effect on the ratio of the adjusted delay times.

Figure 3:
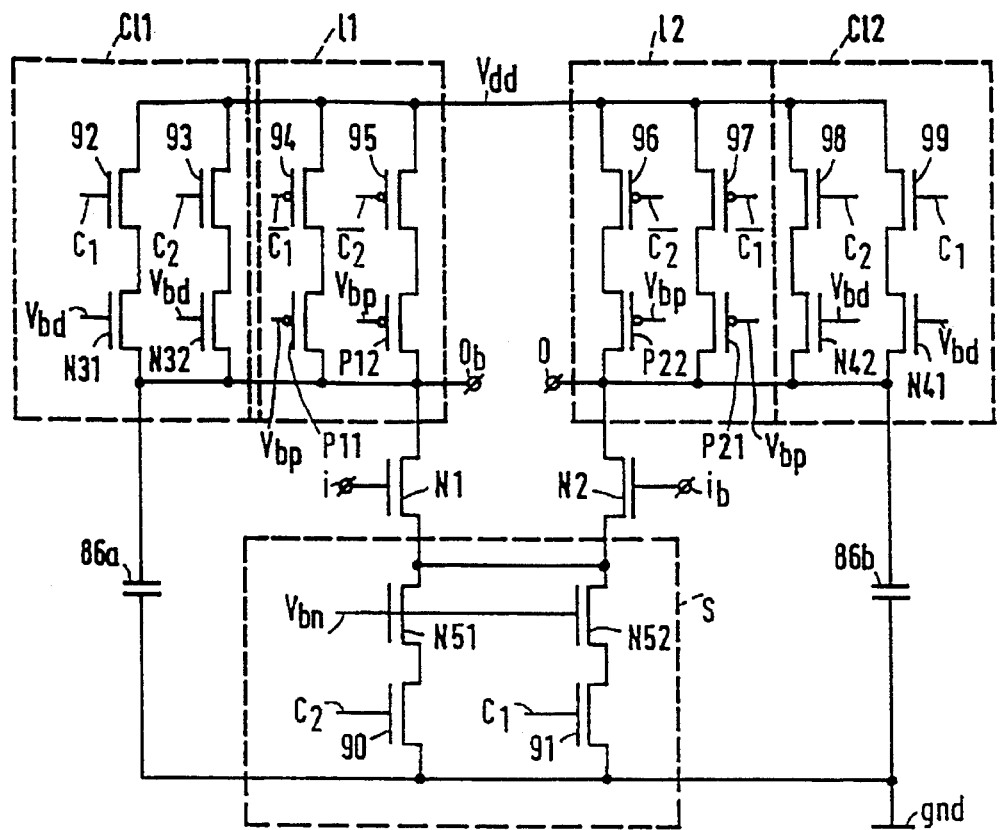
FIG. 3 shows a buffer circuit in which the ratio of the adjustable delay times is less dependent on the parameters of the transistors.

FIG. 3 shows a buffer circuit in which the ratio of the adjustable delay times is less dependent on the parameters of the transistors. The circuit is similar to that of FIG. 2, and elements having the same function therein are denoted by the same symbols. The difference consists in that the NMOS transistor N5 has been replaced by a tail current circuit S which comprises a parallel connection of two series connections, each of which includes the channel of a respective NMOS current source transistor N51, N52 and a current source switching transistor 90, 91. Furthermore, the drains of the switching transistors N1, N2 are connected to the second power supply $V_{dd}$ via switchable load and clamp circuits L1, L2, CL1, CL2.

Each of the load circuits L1, L2 comprises, connected in parallel, two series connections of a respective PMOS load switching transistor 94, 95, 96, 97 and a current-controlling PMOS transistor P11, P12, P21, P22. Each of the clamp circuits CL1, CL2 comprises, in parallel, two series connections of a respective NMOS clamp switching transistor 92, 93, 98, 99 and an NMOS clamp transistor N31, N32, N41, N42. For each circuit on the one output o them is provided a corresponding circuit on the other output ob, both circuits having substantially the same dimensions; because the dimensions are the same, the output signals are almost fully symmetrical.

During operation, the NMOS current source transistors NS1, N52 in the tail current circuit S have the same function as the NMOS transistor N5 in FIG. 2 (supplying a current 2I), be it that the current 2I, supplied under the control of the voltages $C_1$, $C_2$ on the respective gates of the current source switching transistors 90, 91, is switched between different values.

The current controlling PMOS transistors P11, P12, P21, P22 in the load circuits L1, L2 have the same function as the load transistors P1, P2 in FIG. 2 (supplying a current I), the difference existing in that under the control of the voltages $\overline{C}_1$, $\overline{C}_2$ (the logic inverse of $C_1$, $C_2$) on the respective gates of the load switching transistors 94, 95, 96, 97 the current I supplied can be switched between different values in conjunction with the switching of the current 2I by the tail current circuit S.

The NMOS clamp transistors N31, N32, N41, N42 in the clamp circuits CL1, CL2 have the same function as the clamp transistors N3, N4 in FIG. 2 (limiting the minimum voltage), be it that under the control of the voltages $C_1$, $C_2$ on the respective gates of the clamp switching transistors 92, 93, 98, 99 different clamp transistors N31, N32, N41, N42 are activated and deactivated.

For each circuit controlled by $C_1$, there is provided a functionally corresponding circuit which is controlled by $C_2$. The functionally corresponding circuits always have the same structure. Moreover, the ratio of the dimensions of the corresponding circuits is the same for all circuits: the ratio of the dimensions of the clamp circuit controlled by $C_1$ to those of the clamp circuit controlled by $C_2$ is equal to the ratio of the dimensions of the load circuit controlled by $C_1$ to those of the load circuit controlled by $C_2$; the same holds for the tail current circuits. Furthermore, the ratio of all kinds of parasitic effects will also be approximately the same. This ensures that the ratio of the adjusted delay times is reasonably independent of the parameters of the transistors.

Because the clamps CL1, CL2 can also be switched and are switched together with the loads and the tail current source, the ratio of the currents for the various logic values of the voltages $C_1$ and $C_2$ is independent of the parameters of the transistors, so that the buffer is very suitable for use as a switchable delay element in a digitally controlled phase loop.

In FIG. 3 two switching voltages $C_1$ and $C_2$ are used by way of example, but evidently additional independent switching voltages ($C_3$ etc.) can also be used. If only two switching positions are required, one voltage suffices and the other voltage, for example $C_2$, can be permanently connected to the positive power supply $V_{dd}$ (and its inverse $\overline{C}_2$ to the negative power supply (gnd)).

Figure 4:
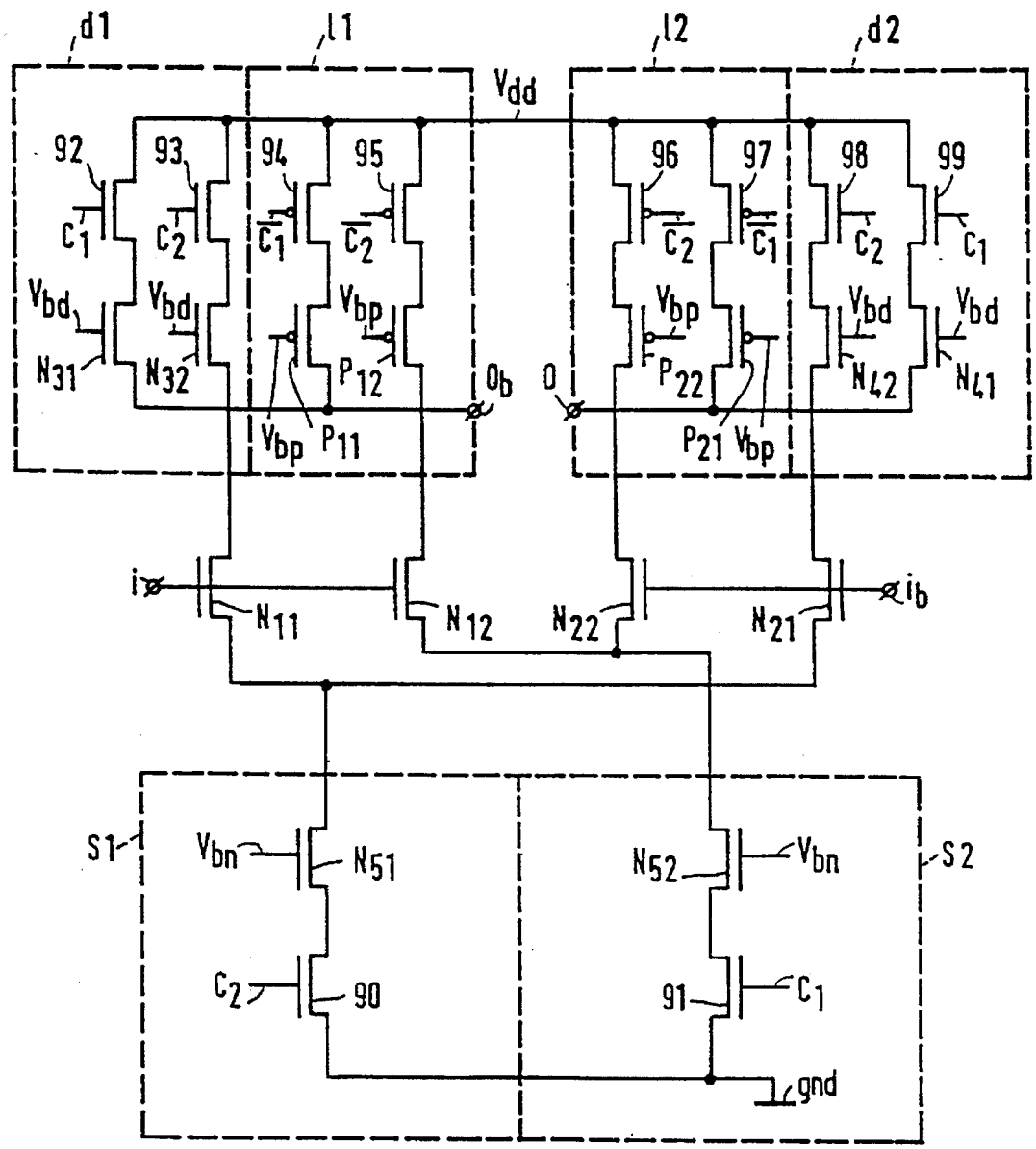
FIG. 4 shows a further embodiment of the buffer circuit.

FIG. 4 shows a further embodiment of the buffer. This embodiment corresponds to that shown in FIG. 3, except that the switching transistors N1, N2 have also been doubled so as to form two pairs N11, N21 and N12, N22, in each pair the sources being connected to one another and to a respective tail current source S1, S2. The sources of the different transistor pairs N11, N21 and N12, N22 and of the tail current sources S1, S2 are not connected to one another. The other elements of FIG. 4 have the same function as those shown in FIG. 3 and are denoted by the same symbols.

During operation, the ratio of the currents occurring for the various values of the switching voltages $C_1$, $C_2$ is even less sensitive to variations in the parameters of the transistors. This can be attributed inter alia to the following. The difference between the voltages on the inputs i, ib normally increases linearly in time. As a result, there will be a time interval during which both switching transistors N1, N2 in the FIGS. 2 and 3 are turned on. The distribution of the current between these transistors is dependent on the parameters of these transistors, notably on their steepness. Because the switching transistors N1, N2 must switch different currents for different values of $C_1$ and $C_2$, the steepness influences the ratio of the switching times. In the circuit shown in FIG. 4, the switching transistors N11, N21 and N12, N22 are also effectively switched on and off by the signals $C_1$ and $C_2$, respectively. As a result, variations in the steepness of the switching transistors N11, N12, N21, N22 are irrelevant to the ratio of the delay times. This results in even better reproducibility of digital control circuits utilizing the buffer as a switchable delay element.

Figure 5:
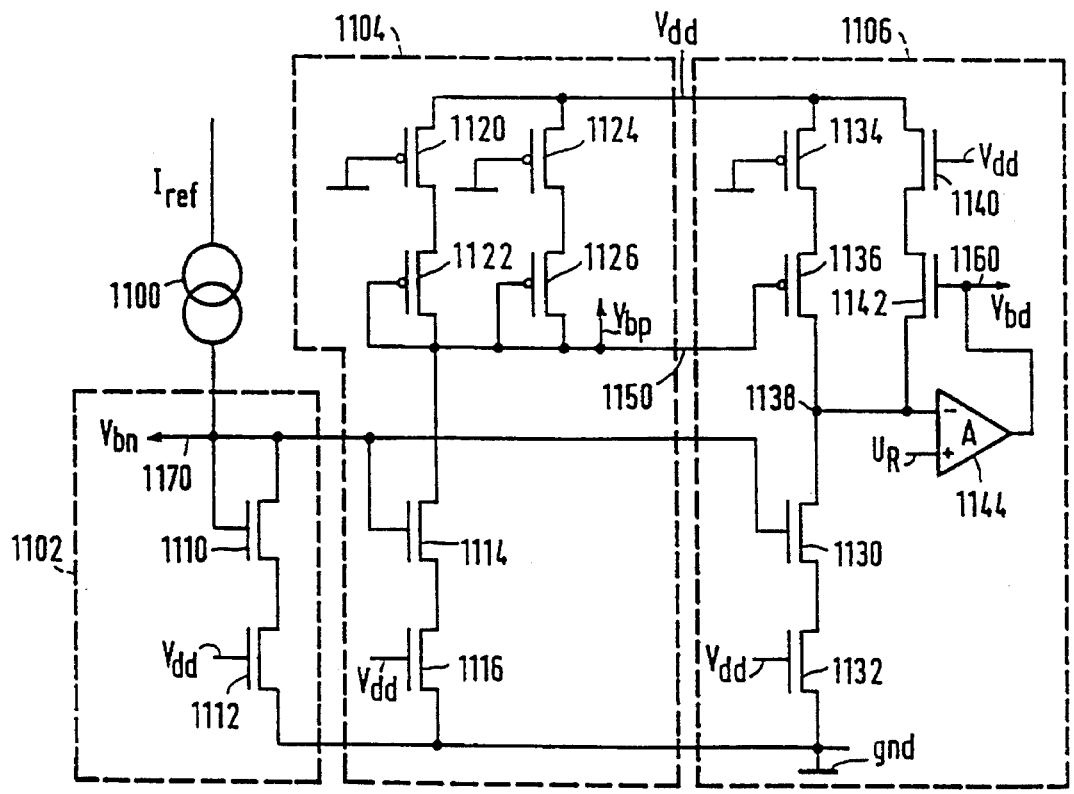
FIG. 5 shows a reference circuit for generating the reference voltages for the circuits shown in the FIGS. 2, 3 and 4.

FIG. 5 shows a reference circuit for generating the reference voltages $V_{bd}$, $V_{bn}$, $V_{bp}$ for the circuits shown in the FIGS. 2, 3 and 4. The reference circuit is a mirror-image of the buffer as shown, for example in FIG. 3. For each component of FIG. 3, with the exception of the switching transistors N1, N2, there is provided a corresponding circuit whereby an associated reference voltage is generated during operation. The reference circuit comprises sub-circuits 1102, 1104, 1106 for generating the voltages $V_{bn}$, $V_{bp}$ and $V_{bd}$ for the tail current circuits S, S1, S2, the load circuits L1, L2 and the clamp circuits CL1 CL2, respectively.

The sub-circuit 1102 for generating $V_{bn}$ comprises a series connection of the channels of two NMOS transistors 1110, 1112 between a current source 1100 and the first power supply (gnd). These two transistors 1110, 1112 correspond to the tail current circuit S of FIG. 3. The gate of one of the transistors, 1110, is connected to its drain, the voltage $V_{bn}$ being tapped from this gate. The gate of the other transistor, 1112, is coupled to the second power supply $V_{dd}$. During operation, the sub-circuit 1102 mirrors the reference current $I_{ref}$ to the tail current circuit S of the buffer by the coupling of $V_{bn}$.

The sub-circuit 1104 for generating $V_{bp}$ comprises two NMOS transistors 1114, 1116 which correspond to the transistors in the load circuits L1, L2. The two NMOS transistors 1114, 1116 are coupled to the transistors 1110, 1112 so that they form, in conjunction with the transistors 1110, 1112 of the sub-circuit 1102, a current mirror for mirroring the reference current $I_{ref}$. The output of this current mirror is connected, via a parallel connection of two series connections of the channels of PMOS transistors 1120, 1122, 1124, 1126, to the second power supply $V_{dd}$. The gate of one PMOS transistor 1122, 1126 in each series connection is connected to its drain. The voltage $V_{bn}$ is tapped from the drains of the transistors 1122, 1126. The gate of the other PMOS transistor 1120, 1124 is connected to ground. When transistors are used, the sub-circuit 1104 mirrors halve the reference current to the load circuits L1, L2 via the coupling of $V_{bp}$.

The sub-circuit 1106 for generating $V_{bd}$ comprises two PMOS transistors 1134, 1136 which are coupled to the PMOS transistors 1120, 1122 so that they form a current mirror in conjunction with the transistors 1120, 1122 of the sub-circuit 1104. The output of this current mirror is connected to the first power supply via a series connection of the channels of two NMOS transistors 1130, 1132. The gate of one of these transistors, 1130, is coupled to $V_{bn}$, the gate of the other transistor, 1132, being connected to the second power supply $V_{dd}$. In parallel with the two PMOS transistors 1134, 1136 there is connected a series connection of the channels of two further NMOS transistors. These further transistors correspond to the transistors of the clamp circuits CL1, CL2. The junction 1138 of the PMOS transistors 1136, 1134 and the NMOS transistors 1130, 1132 is coupled to the inverting input of a control amplifier 1144. The output of this control amplifier is coupled to the gate of one of the further NMOS transistors 1160. The gate of the other further NMOS transistor is coupled to the second power supply $V_{dd}$. The non-inverting input of the control amplifier 1144 is connected to a reference voltage $U_R$. The control amplifier 1144 readjusts $V_{bd}$ so that the clamp voltage for the given currents equals $U_R$. It has been found that $U_R=V_{dd}/2$ offers suitable results, but if the dependency on possible fluctuations in the supply voltage is undesirable, use can also be made of a reference voltage source, for example a bandgap reference.

Figure 6:
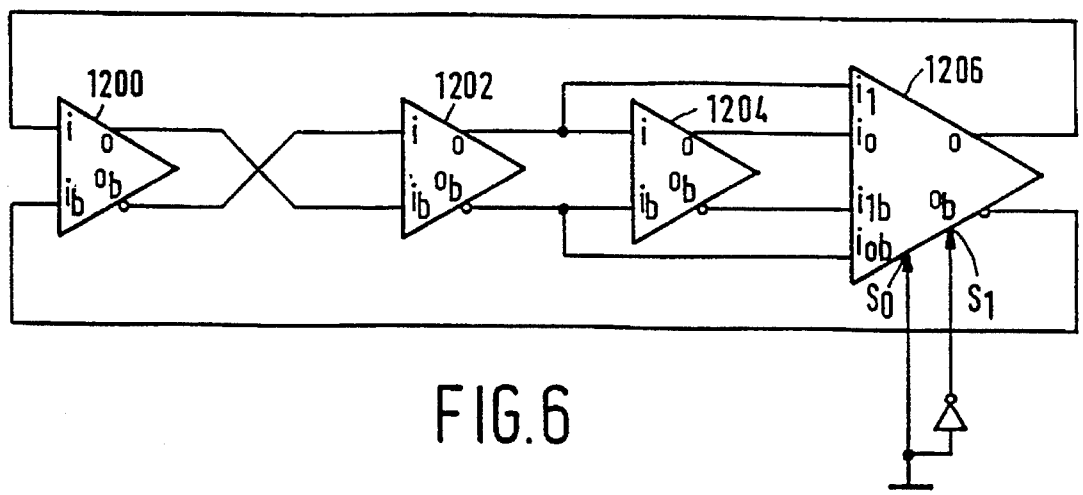
FIG. 6 shows a further ring oscillator.

FIG. 6 shows a further ring oscillator. This oscillator comprises, by way of example, four symmetrical buffer circuits 1200, 1202, 1204, 1206 which are connected in series. Only the first and the second symmetrical buffer circuits, 1200, 1202 are cross-wise coupled. As a result, the circular loop gain is negative. The outputs of the second buffer circuit, 1202, as well as of the third buffer circuit, 1204, are coupled to respective inputs of the fourth buffer circuit, 1206. The fourth buffer circuit, 1206, also constitutes a multiplexer and comprises control inputs S0, S1 which receive logically opposed signals. This controls which of the input signals is applied to the outputs.

During operation, the number of buffer circuits in the ring oscillator, and hence the oscillation frequency, can be controlled by way of the control inputs S0, S1. This is a further mechanism which can be used for digital control of the frequency of a ring oscillator.

Only one of the buffer circuits in FIG. 6 is a multiplexer. It is alternatively possible to include several multiplexers in the ring oscillator, so that a larger or smaller part of the buffer circuits in the ring oscillator can be skipped in a controlled manner so as to achieve digital control of the oscillation frequency.

Figure 7:
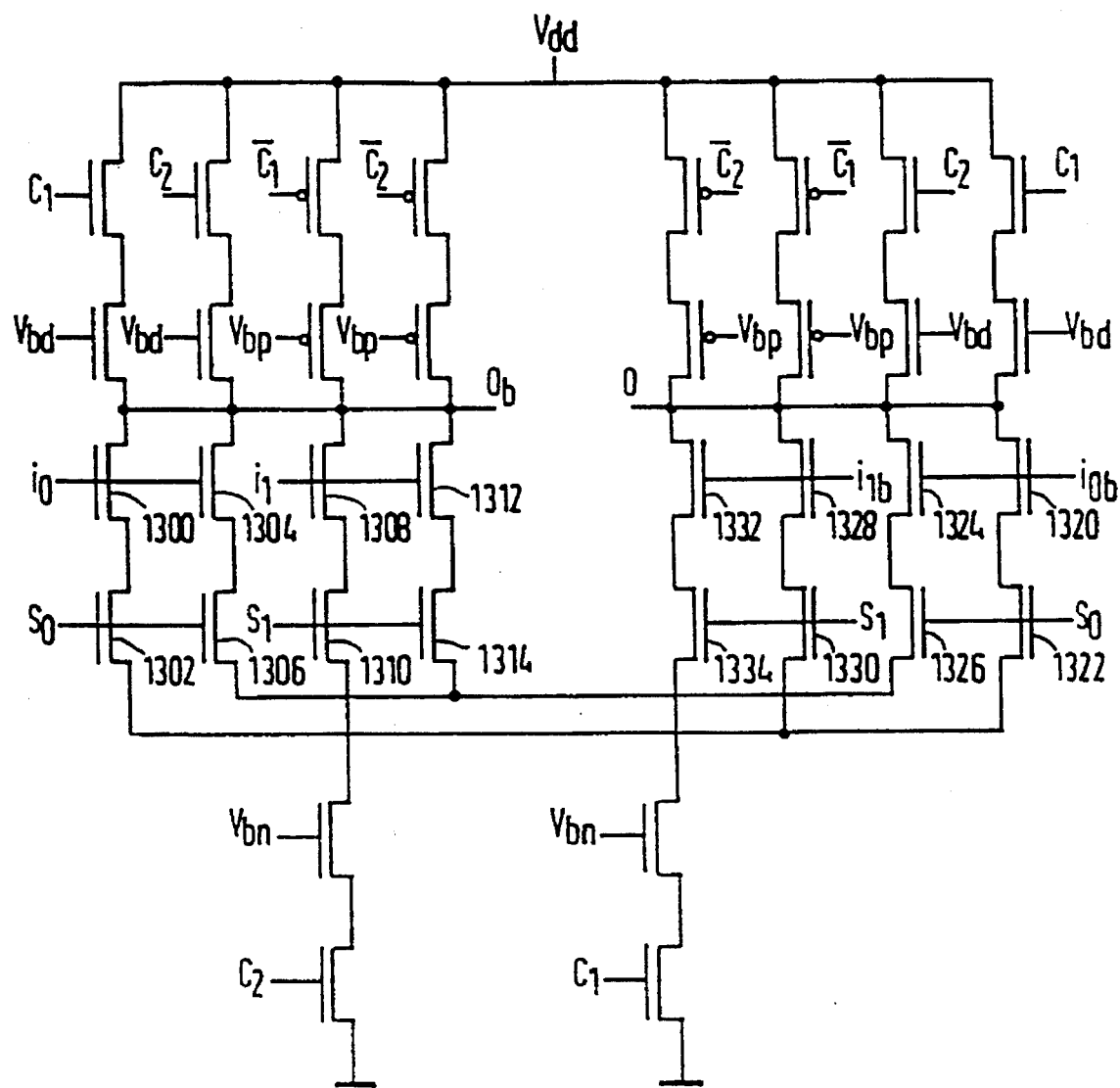
FIG. 7 shows an embodiment of a buffer circuit which also serves as a multiplexer.

FIG. 7 shows an embodiment of the buffer circuit which also serves as a multiplexer. The majority of the components correspond to the components of FIG. 4 and are not elaborated. The difference with respect to FIG. 4 consists in that the switching transistors N11, N12, N21, N22 of FIG. 4 have been replaced in FIG. 7 by a respective parallel connection of two series connections of the channels of two transistors (N11 replaced by 1300, 1302 in series, and 1308, 1310 in series; N12 by 1304, 1306 in series and 1312, 1314 in series; N21 by 1320, 1322 in series and 1330, 1328 in series; N22 by 1324, 1326 in series and 1332, 1334 in series).

During operation, each time one of every two parallel-connected series connections is activated by means of S0, S1. One of the input signals i1, i0 corresponds to each S0, S1. Consequently, always only one of the input signals i1, i0 is active. The active input signal determines, in the manner described with reference to the FIGS. 2, 3 and 4, the load circuit whereto the current flows. The signals on S0, S1 determine which of the input signals i1, i0 is applied to the output o, ob in this manner.

I claim:

1. A delay circuit for delaying of differential signals, comprising a first input and a second input, a first output and a second output, a first current source, a first switching transistor and a second switching transistor each comprising a control electrode and a first main electrode and a second main electrode, the first input and the second input of the delay circuit being coupled to the control electrodes of the first switching transistor and the second switching transistor, respectively, the first main electrodes of the first switching transistor and the second switching transistor being coupled to one another and, via the first current source, to a first power supply terminal, the second main electrodes of the first switching transistor and the second switching transistor being coupled to the first output and the second output, respectively, of the delay circuit, the delay circuit further comprising first load circuits for coupling, respectively, the first output and the second output to a second power supply terminal, and respective first clamp circuits coupled to the first output and the second output for limiting differences between a voltage on the second power supply terminal and voltages on the first output and the second output, characterized in that the delay circuit comprises a second current source, second load circuits, second clamp circuits, and switching means for selectively connecting the second current source, the second load circuits and the second clamp circuits in parallel with the first current source, the first load circuits, and the first clamp circuits, respectively.

2. The delay circuit as claimed in claim 1, characterized in that the delay circuit is included in an integrated circuit in which substantially similar circuits are used for the first current source and the second current source, substantially similar circuits are used for the first load circuits and the second load circuits, and substantially similar circuits are used for the first clamp circuits and the second clamp circuits, wherein a ratio of the geometrical dimensions of the circuits of each pair are the same.

3. The delay circuit as claimed in claim 1, characterized in that the delay circuit comprises a third switching transistor and a fourth switching transistor, said third and fourth switching transistors having control electrodes and second main electrodes connected in parallel to the control electrodes and the second main electrodes of the first and second switching transistors, respectively, the third and fourth switching transistors also having first main electrodes coupled together and, separately from the first main electrodes of the first and second switching transistors, connected to the first power supply terminal via the second current source.

4. The delay circuit as claimed in claim 2, characterized in that the delay circuit comprises a third switching transistor and a fourth switching transistor, said third and fourth switching transistors having control electrodes and second main electrodes connected in parallel to the control electrodes and the second main electrodes of the first and second switching transistors, respectively, the third and fourth switching transistors also having first main electrodes coupled together and, separately from the first main electrodes of the first and second switching transistors, connected to the first power supply terminal via the second current source.

5. A delay circuit as claimed in claim 1, characterized in that the delay circuit comprises, between the first current source and the first output, a parallel connection of a first and a second series connection of main current paths between first and second main electrodes of transistors, the first switching transistor forming part of the first series connection, the transistors of said first series connection having control electrodes which are coupled to the first input and a first selection input, respectively, the transistors of said second series connection having control electrodes which are coupled to a further first input and a second selection input, respectively, and in that the delay circuit comprises a third and a fourth series connection of main current paths between first and second main electrodes of transistors, connected in parallel between the second current source and the second output, the second switching transistor forming part of the third series connection, the transistors of said third series connection having control electrodes which are coupled to the second input and the first selection input, respectively, the transistors of the fourth series connection having control electrodes which are coupled to a further second input and the second selection input, respectively.

6. The delay circuit as claimed in claim 2, characterized in that the delay circuit comprises, between the current source and the first output, a parallel connection of a first and a second series connection of main current paths between first and second main electrodes of transistors, the first switching transistor forming part of the first series connection, the transistors of said first series connection having control electrodes which are coupled to the first input and a first selection input, respectively, the transistors of the second series connection having control electrodes which are coupled to a further first input and a second selection input, respectively, and in that the delay circuit comprises a third and a fourth series connection of main current paths between first and second main electrodes of transistors, connected in parallel between the second current source and the second output, the second switching transistor forming part of the third series connection, the transistors of said third series connection having control electrodes which are coupled to the second input and the first selection input, respectively, the transistors of the fourth series connection having control electrodes which are coupled to a further second input and the second selection input, respectively.

7. The delay circuit as claimed in claim 3, characterized in that the delay circuit comprises, between the current source and the first output, a parallel connection of a first and a second series connection of main current paths between first and second main electrodes of transistors, the first switching transistor forming part of the first series connection, the transistors of said first series connection having control electrodes which are coupled to the first input and a first selection input, respectively, the transistors of said second series connection having control electrodes which are coupled to a further first input and a second selection input, respectively, and in that the delay circuit comprises a third and a fourth series connection of main current paths between first and second main electrodes of transistors, connected in parallel between the second current source and the second output, the second switching transistor forming part of the third series connection, the transistors of the third series connection having control electrodes which are coupled to the second input and the first selection input, respectively, the transistors of said fourth series connection having control electrodes which are coupled to a further second input and the second selection input, respectively.

8. The delay circuit as claimed in claim 4, characterized in that the delay circuit comprises, between the current source and the first output, a parallel connection of a first and a second series connection of main current paths between first and second main electrodes of transistors, the first switching transistor forming part of the first series connection, the transistors of said first series connection having control electrodes which are coupled to the first input and a first selection input, respectively, the transistors of said second series connection having control electrodes which are coupled to a further first input and a second selection input, respectively, and in that the delay circuit comprises a third and a fourth series connection of main current paths between first and second main electrodes of transistors, connected in parallel between the second current source and the second output, the second switching transistor forming part of the third series connection, the transistors of said third series connection having control electrodes which are coupled to the second input and the first selection input, respectively, the transistors of said fourth series connection having control electrodes which are coupled to a further second input and the second selection input, respectively.

9. The delay circuit as claimed in claim 1, characterized in that the respective first load circuits are constructed as current controllers which are adapted to draw substantially half the amount of current supplied by the current source.

10. The delay circuit as claimed in claim 1, characterized in that the respective clamp circuits each comprises a clamp transistor which is coupled to the respective output by a first main electrode, and a control electrode of said clamp transistor receiving a reference voltage.

11. A cascade of delay circuits, each of said delay circuits being suitable for delaying differential signals, each of said delay circuits comprising a first input and a second input, a first output and a second output, a first current source, a first switching transistor and a second switching transistor each comprising a control electrode and a first main electrode and a second main electrode, the first input and the second input of the delay circuit being coupled to the control electrodes of the first switching transistor and the second switching transistor, respectively, the first main electrodes of the first switching transistor and the second switching transistor being coupled to one another and, via the first current source, to a first power supply terminal, the second main electrodes of the first switching transistor and the second switching transistor being coupled to the first output and the second output, respectively, of the delay circuit, each delay circuit further comprising first load circuits for coupling, respectively, the first output and the second output to a second power supply terminal, and respective first clamp circuits coupled to the first output and the second output for limiting differences between a voltage on the second power supply terminal and voltages on the first output and the second output, characterized in that each delay circuit comprises a second current source, second load circuits, second clamp circuits, and switching means for selectively connecting the second current source, the second load circuits and the second clamp circuits in parallel with the first current source, the first load circuits, and the first clamp circuits, respectively.

12. The cascade of delay circuits as claimed in claim 11, wherein at least one of said delay circuits comprises, between the first current source and the first output, a parallel connection of a first and a second series connection of main current channels of transistors, the first switching transistor forming part of the first series connection having control electrodes which are coupled to the first input and a first selection input, respectively, the second series connection having control electrodes which are coupled to a further first input and a second selection input, respectively, and in that the delay circuit comprises a third and a fourth series connection of main current channels of transistors, connected in parallel between the second current source and the second output, the second switching transistor forming part of the third series connection with control electrodes which are coupled to the second input and the first selection input, respectively, the fourth series connection comprising control electrodes which are coupled to a further second input and the second selection input, respectively, characterized in that the outputs of one of the delay circuits, secondly preceding said at least one delay circuit, are connected to the further first and second input of said at least one delay circuit.

13. The cascade of delay circuits as claimed in claim 11, characterized in that the outputs of a last delay circuit in the cascade of delay circuits are coupled back to the inputs of a first delay circuit in the cascade of delay circuits so that a loop gain of the cascade of delay circuits is negative.

14. The cascade of delay circuits as claimed in claim 12, characterized in that the outputs of a last delay circuit in the cascade of delay circuits are coupled back to the inputs of a first delay circuit in the cascade of delay circuits so that a loop gain of the cascade of delay circuits is negative.

* * * * *